United States Patent
Chen et al.

(10) Patent No.: US 10,535,664 B2
(45) Date of Patent: Jan. 14, 2020

(54) FABRICATING METHOD OF OXIDE LAYER WITHIN PERIPHERAL CIRCUIT REGION

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Po-Chun Chen, Tainan (TW); Wei-Hsin Liu, Changhua County (TW); Chia-Lung Chang, Tainan (TW); Yi-Wei Chen, Taichung (TW); Han-Yung Tsai, Tainan (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 16/012,744

(22) Filed: Jun. 19, 2018

(65) Prior Publication Data

US 2019/0363093 A1 Nov. 28, 2019

(30) Foreign Application Priority Data

May 28, 2018 (CN) .......................... 2018 1 0520798

(51) Int. Cl.
| | |
|---|---|
| *H01L 21/336* | (2006.01) |
| *H01L 27/108* | (2006.01) |
| *H01L 29/66* | (2006.01) |
| *H01L 21/02* | (2006.01) |
| *H01L 21/265* | (2006.01) |
| *H01L 21/266* | (2006.01) |
| *H01L 29/78* | (2006.01) |

(52) U.S. Cl.
CPC .. *H01L 27/10894* (2013.01); *H01L 21/02057* (2013.01); *H01L 21/266* (2013.01); *H01L 21/26513* (2013.01); *H01L 27/10897* (2013.01); *H01L 29/6659* (2013.01); *H01L 29/7833* (2013.01)

(58) Field of Classification Search
CPC ................................................ H01L 27/10894
USPC ........................................................ 438/305
See application file for complete search history.

(56) References Cited

U.S. PATENT DOCUMENTS

| | | | | |
|---|---|---|---|---|
| 2002/0033505 | A1* | 3/2002 | Kujirai | ............ H01L 21/823814 |
| | | | | 257/350 |
| 2012/0295420 | A1* | 11/2012 | Pal | .................... H01L 21/02057 |
| | | | | 438/478 |
| 2015/0243545 | A1 | 8/2015 | Tang | |

FOREIGN PATENT DOCUMENTS

CN 101140851 A * 3/2008

* cited by examiner

*Primary Examiner* — Ajay Arora
(74) *Attorney, Agent, or Firm* — Winston Hsu (57) ABSTRACT

A method of changing a formation rate of silicon oxide includes providing a substrate, wherein two conductive lines are disposed on the substrate and a recess is between the conductive lines. Later, a cleaning process is performed to clean the substrate and the conductive lines using diluted hydrofluoric acid. After the cleaning process, a silicon oxide layer is formed to cover a sidewall and a bottom of the recess, wherein a formation rate of the silicon oxide layer at the bottom of the recess is greater than a formation rate of the silicon oxide layer at the sidewall of the recess.

13 Claims, 8 Drawing Sheets

FABRICATING METHOD OF OXIDE LAYER WITHIN PERIPHERAL CIRCUIT REGION

BACKGROUND OF THE INVENTION

1. Field of the Invention

The present invention relates to a fabricating method of a silicon oxide layer within a peripheral circuit region, and more particularly to a method of using diluted hydrofluoric acid to clean a memory cell region and a peripheral circuit region before forming a silicon oxide layer.

2. Description of the Prior Art

A dynamic random access memory (DRAM) is the most widely used semiconductor storage device on computers and microprocessor-based systems requiring volatile memory for temporary storage of data. Each of the memory cells of a dynamic random access memory (DRAM) includes a storage capacitor for storing an electric charge, which characterizes the information content of the memory cell, and a cell transistor for selectively addressing the memory cell.

The memory cells are disposed within the memory cell region of a substrate. A peripheral circuit region is next to the memory cell region. Peripheral transistors are arranged in the peripheral circuit region. Conventionally when forming the spacer on the peripheral transistors, a spacer material layer is formed to cover the cell transistors and the peripheral transistors. Voids are often formed in the spacer material layer within the memory cell region, however, which can cause damage to the gate structure of the peripheral transistors during formation of the spacer on the peripheral transistors.

SUMMARY OF THE INVENTION

According to a preferred embodiment of the present invention, a fabricating method of an oxide layer within a peripheral region includes providing a substrate divided into a memory cell region and a peripheral circuit region, wherein a plurality of conductive lines are disposed in the memory cell region, and a gate structure is disposed within the peripheral circuit region. Next, a first implantation process is performed to form a lightly doped region in the substrate at two sides of the gate structure, respectively. After the first implantation process, a cleaning process is performed to clean the memory cell region and the peripheral circuit region using diluted hydrofluoric acid. After the cleaning process, an oxide layer is formed to cover the memory cell region, the peripheral circuit region, the conductive lines and the gate structure.

According to another preferred embodiment of the present invention, a method of changing a formation rate of silicon oxide includes providing a substrate, wherein two conductive lines are disposed on the substrate and a recess is between the conductive lines. Next, a cleaning process is performed to clean the substrate and the conductive lines using diluted hydrofluoric acid. After the cleaning process, a silicon oxide layer is formed to cover a sidewall and a bottom of the recess. A formation rate of the silicon oxide layer at the bottom of the recess is greater than a formation rate of the silicon oxide layer at the sidewall of the recess.

According to another preferred embodiment of the present invention, a silicon nitride layer is formed to cover a sidewall and a bottom of the recess before the cleaning process.

The present invention uses diluted hydrofluoric acid to clean a silicon nitride layer. After the cleaning, the silicon oxide layer on the silicon nitride layer on the bottom of the recess is deposited faster than the silicon oxide layer on the silicon nitride layer on the sidewall of the recess. In this way, the silicon oxide layer can fill up the recess before the silicon oxide layer seals up the recess.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 4 and FIG. 6 to FIG. 8 depict a fabricating method of an oxide layer within a peripheral region according to a preferred embodiment of the present invention, wherein:

DETAILED DESCRIPTION

FIG. 1 to FIG. 4 and FIG. 6 to FIG. 8 depict a fabricating method of an oxide layer within a peripheral region according to a preferred embodiment of the present invention.

Figure 1:
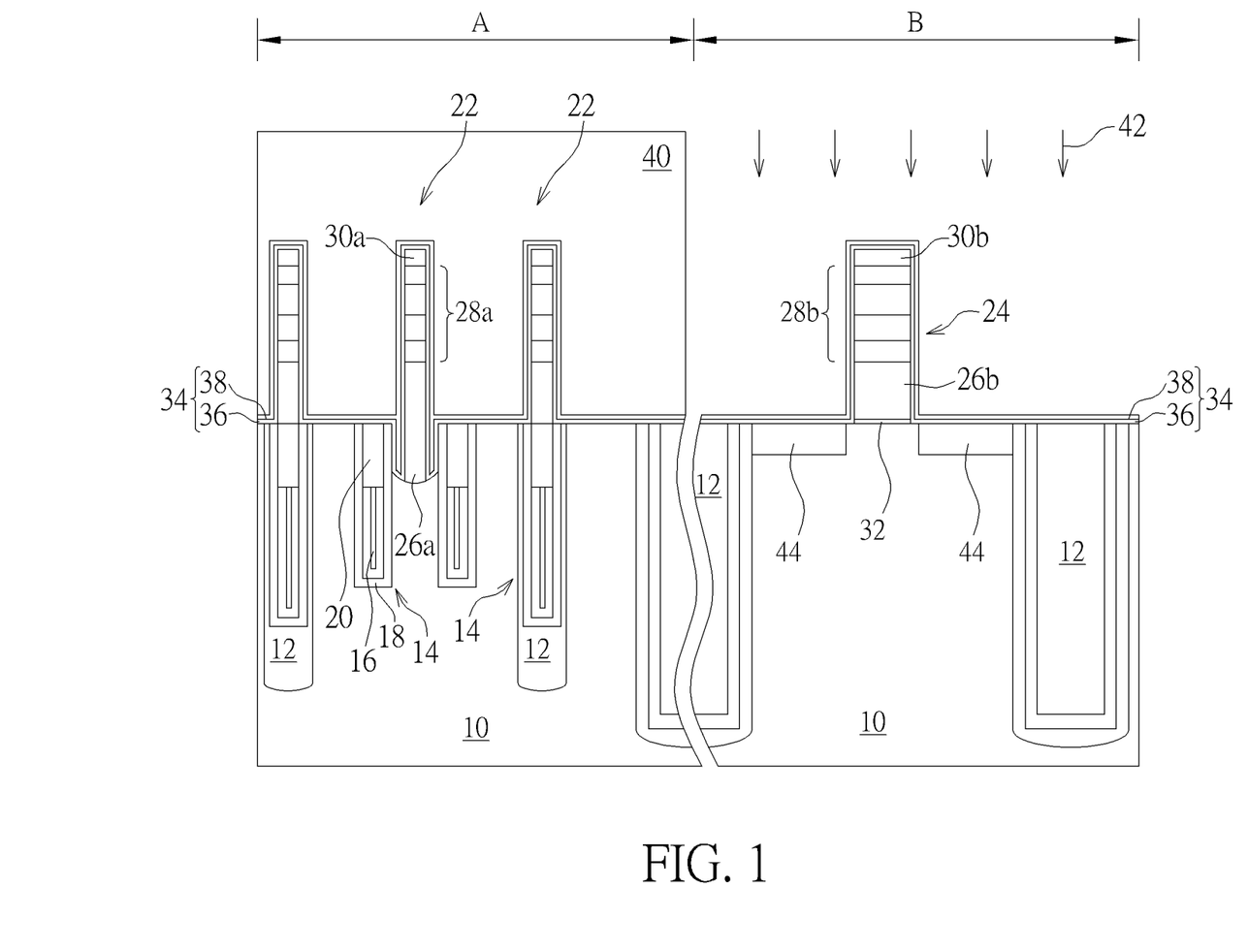
FIG. 1 depicts a substrate with memory cells and a gate structure.

As shown in FIG. 1, a substrate 10 is provided. The substrate 10 is divided into a memory cell region A and a peripheral circuit region B. The substrate 10 may be a bulk silicon substrate, a germanium substrate, a gallium arsenide substrate, a silicon germanium substrate, an indium phosphide substrate, a gallium nitride substrate, a silicon carbide substrate, or a silicon on insulator (SOI) substrate. Numerous memory cells such as dynamic random access memories (DRAMs) are disposed within the memory cell region A. In other embodiments of the present invention, the memory cells can be memory cells which are different from DRAMs. Furthermore, numerous shallow trench isolations (STIs) 12 are disposed within the memory cell region A and the peripheral circuit region B. The STIs 12 are used to define active regions in the memory cell region A and the peripheral circuit region B, and provide electrical isolation for these active regions.

Numerous buried word lines 14 are disposed in the memory cell region A of the substrate 10. Some of the buried word lines 14 pass the STIs 12, and some of the buried word lines 14 are in the active regions. Each of the buried word lines 14 includes a buried gate 16 and a dielectric layer 18. A cap layer 20 covers the buried gate 16. The buried gate 16 may be polysilicon, metal or other conductive materials. The dielectric layer 18 may be oxide, silicon oxide, silicon oxynitride (SiON), silicon nitride ($Si_3N_4$), tantalum oxide ($Ta_2O_5$), aluminum oxide ($Al_2O_5$), hafnium oxide ($HfO_2$), nitrogen-containing material, hafnium containing material, tantalum-containing material, aluminum containing material or high-k dielectrics having a dielectric constant greater than 5, or any combination thereof.

Numerous conductive lines such as bit lines 22 are disposed on the memory cell region A of the substrate 10. The bit lines 22 cross the buried word lines 14 under a top view (not shown). The figure in the present invention is a sectional view. In the sectional view, two of the bit lines 22 respectively overlap one of the buried word lines 14. One of the bit lines 22 is disposed between two buried word lines 14. At least one gate structure 24 is disposed within the peripheral circuit region B of the substrate 10. The fabricating method of the bit lines 22 and the gate structure 24 is by the following steps. First, a gate dielectric layer 32 is formed in the peripheral circuit region B. Then, numerous material layers such as a gate material layer, a conductive material layer, and a protective layer are deposited in the memory cell region A and the peripheral circuit region B. Later, the numerous material layers are patterned to form three bit lines 22 and one gate structure 24 shown in FIG. 1. Each of the bit lines 22 includes a bit line gate 26*a*, a conductive layer 28*a* and a protective layer 30*a*. The gate structure 24 includes a gate dielectric layer 32, a gate 26*b*, a conductive layer 28*b* and a protective layer 30*b*. The conductive layers 28*a*/28*b* may be a multiple-layered material stacked by silicon titanium, titanium nitride, silicon tungsten and tungsten from bottom to top. The bit line gate 26*a* and the gate 26*b* may be polysilicon, metal or other conductive materials. The protective layer 30*a*/30*b* may be silicon nitride or other insulating materials. The bit line gate 26*a* of the bit line 22 between two adjacent buried word lines 14 is partly embedded in the substrate 10. The bit line gate 26*a* embedded in the substrate 10 serves as a bit line plug. An insulating layer 34 such as silicon nitride, silicon carbon nitride or a stacked material including silicon nitride and silicon carbon nitride covers the substrate 10, the gate structure 24 and the bit lines 22. In this embodiment, the insulating layer 34 includes a silicon carbon nitride layer 36 and a silicon nitride layer 38. The silicon nitride layer 38 is stacked on the silicon carbon nitride layer 36. In other words, the silicon nitride layer 38 is exposed.

Figure 2:
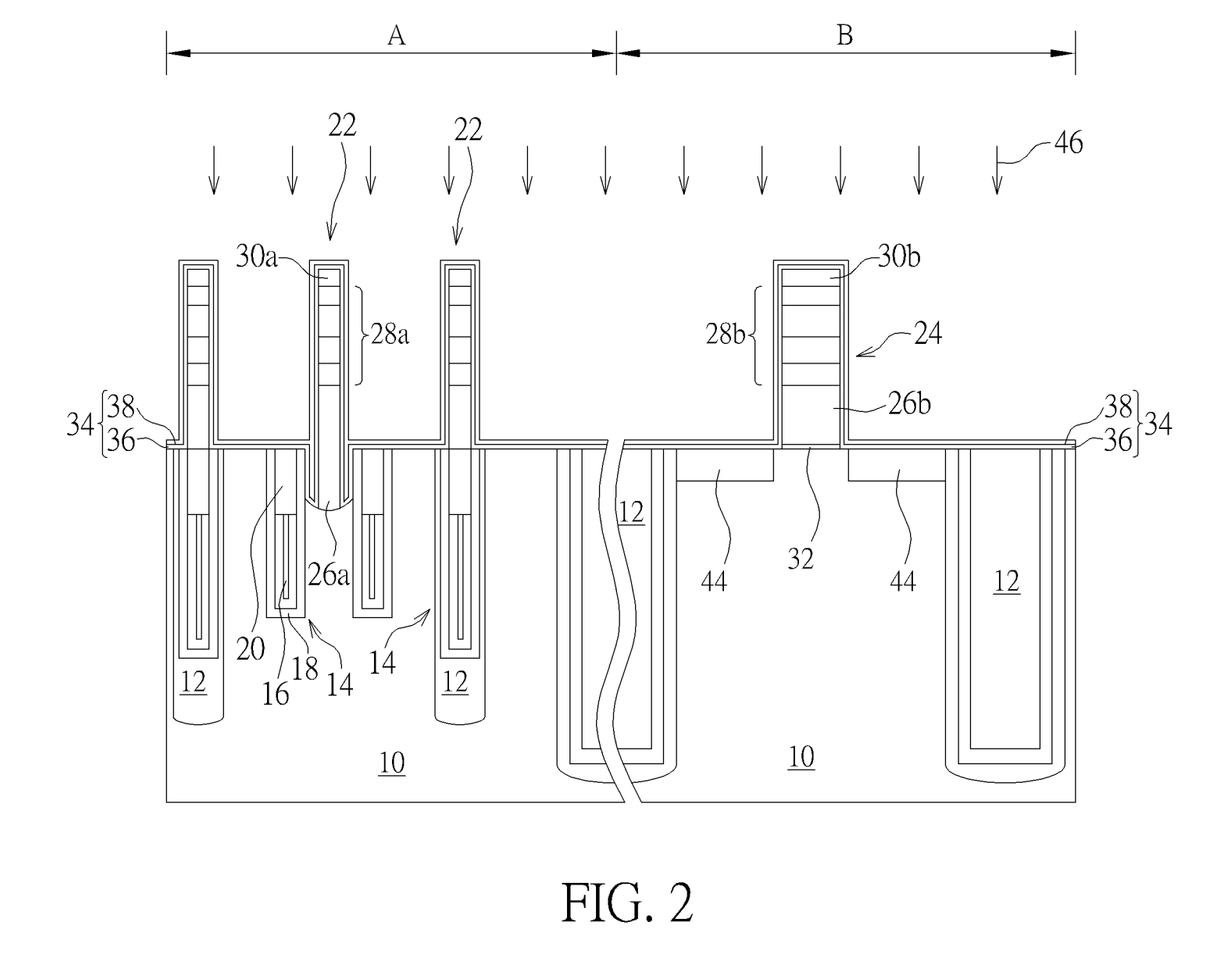
FIG. 2 is a fabricating stage following FIG. 1.

A photoresist 40 is formed to cover the memory cell region A and exposes the peripheral circuit region B. Then, an ion implantation process 42 is performed to form a lightly doped region 44 in the substrate 10 at two sides of the gate structure 24, respectively. As shown in FIG. 2, the photoresist 40 is removed. After removing the photoresist 40, a cleaning process 46 is performed. The cleaning process 46 includes cleaning the memory cell region A and the peripheral circuit region B using diluted hydrofluoric acid. The purpose of the cleaning process 46 is to remove the residues formed during the ion implantation process 42. During the cleaning process 46, only the diluted hydrofluoric acid is used to clean the memory cell region A and the peripheral circuit region B. No other solution is used during the cleaning process 46. During the cleaning process 46, the diluted hydrofluoric acid directly contacts the silicon nitride layer 38.

Figure 3:
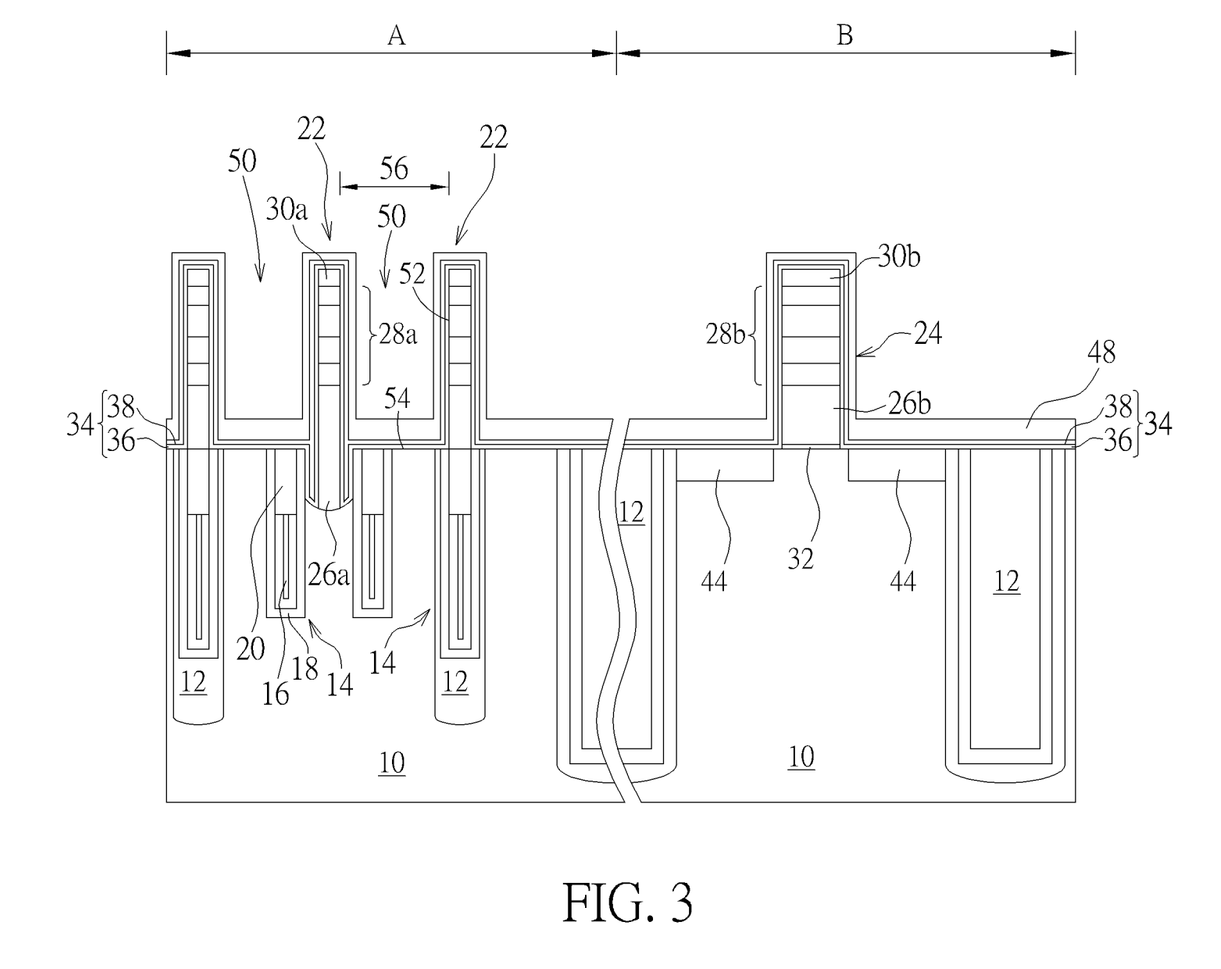
FIG. 3 is a fabricating stage following FIG. 2.

As shown in FIG. 3, an oxide layer 48 is formed to simultaneously cover the memory cell region A, the peripheral circuit region B, the bit lines 22 and the gate structure 24. After the cleaning process 46 and before forming the oxide layer 48, only diluted hydrofluoric acid is used to clean the memory cell region A and the peripheral circuit region B, and no other solutions (such as a mixture of phosphoric acid, hydrogen peroxide, ammonium hydroxide and deionized water) is used during the cleaning process 46. The oxide layer 48 is preferably silicon oxide. The oxide layer 48 can be formed by an atomic layer deposition, a chemical vapor deposition or a physical vapor deposition.

According to a preferred embodiment of the present invention, the oxide layer 48 is formed by an atomic layer deposition. The oxide layer 48 serves as a spacer material of the gate structure 24. The oxide layer 48 will be used to form a spacer on the gate structure 24 in the following steps. Additionally, a recess 50 is disposed between the conductive lines 22 adjacent to each other. The recess 50 includes a sidewall 52, a bottom 54 and an opening 56. The aspect ratio of the recess 50 is between 10 and 12. During the formation of the oxide layer 48, the oxide layer 48 conformally covers and contacts silicon nitride layer 38 on the sidewall 52 and on the bottom 54 of the recess 50. The opening 56 becomes smaller because it is filled in by the oxide layer 48.

Figure 4:
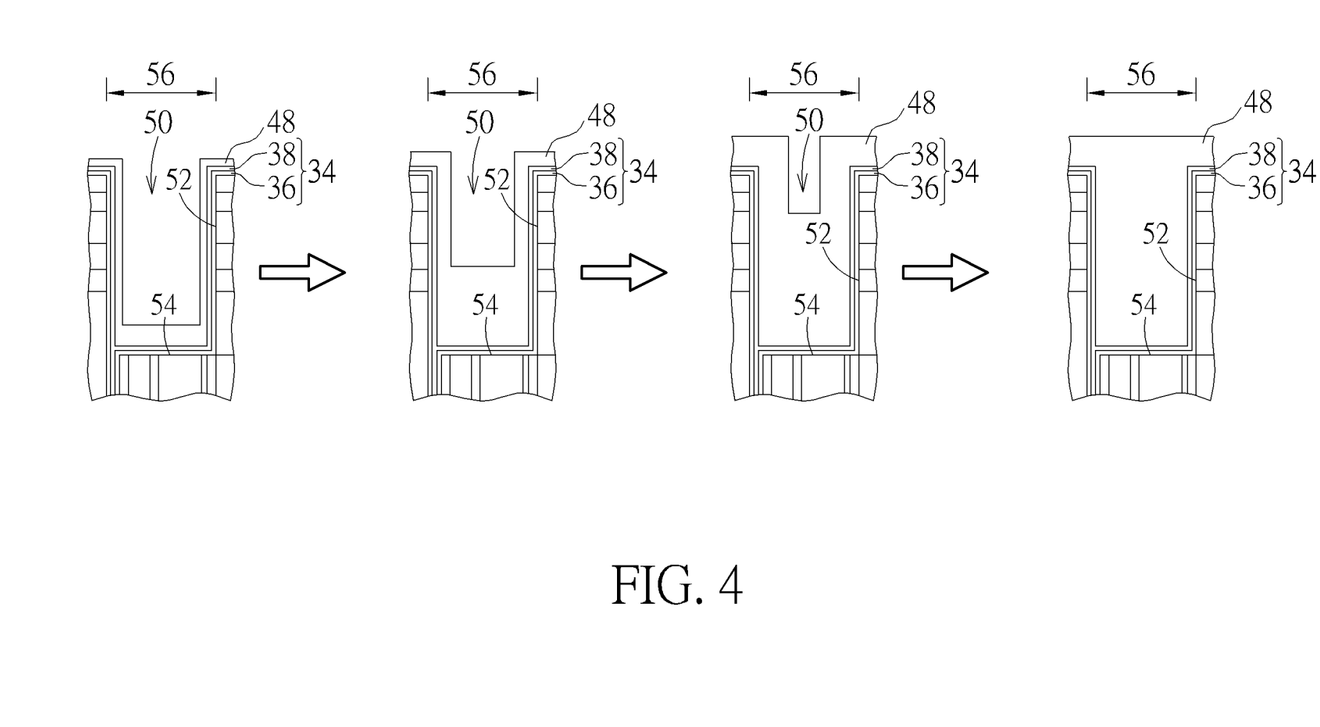
FIG. 4 depicts detailed fabricating steps of FIG. 3.

FIG. 4 depicts detailed steps of the oxide layer 48 filling in the recess 50. For the sake of simplicity, only the recess 50, the sidewall 52, the bottom 54, the insulating layer (including the silicon nitride layer 38 and the silicon carbon nitride layer 36) and the opening 56 are shown in FIG. 4. As shown in FIG. 2 and FIG. 4, it is noteworthy that, during the cleaning process 46, diluted hydrofluoric acid can remove the silicon oxide such as native oxide remains on the silicon nitride layer 38. Furthermore, the diluted hydrofluoric acid has better cleaning efficiency with respect to the silicon oxide on the silicon nitride layer 38 on the bottom 54 than to the silicon oxide on the silicon nitride layer 38 on the sidewall 52. Moreover, the deposition rate of the oxide layer 48 to be deposited on the silicon nitride layer 38 would be decreased if any silicon oxide remains. Because the diluted hydrofluoric acid has better cleaning efficiency with respect to the silicon oxide on the bottom 54, after the cleaning process 46 is completed, the amount of silicon oxide remaining on the bottom 54 is less than the amount of silicon oxide remaining on the sidewall 52. The result is that the deposition rate of the oxide layer 48 on the bottom 54 is greater than the deposition rate of the oxide layer 48 on the sidewall 52. In detail, after using the diluted hydrofluoric acid to clean the recess 50, the deposition rate of the oxide layer 48 on the silicon nitride layer 38 on the bottom 54 is greater than the deposition rate of the oxide layer 48 on the silicon nitride layer 38 on the sidewall 52. The oxide layer 48 becomes thicker from the bottom 54 of the recess 50, and the thickness of the oxide layer 48 on the sidewall 52 also becomes thicker, causing the opening 56 to become smaller. The rate of the oxide layer 48 becoming thicker from the bottom 54 is greater than the rate of the opening 56 becoming smaller. As a result, before the opening 56 is sealed by the oxide layer 48, the oxide layer 48 fills up the recess 50 from the bottom 54.

Figure 5:
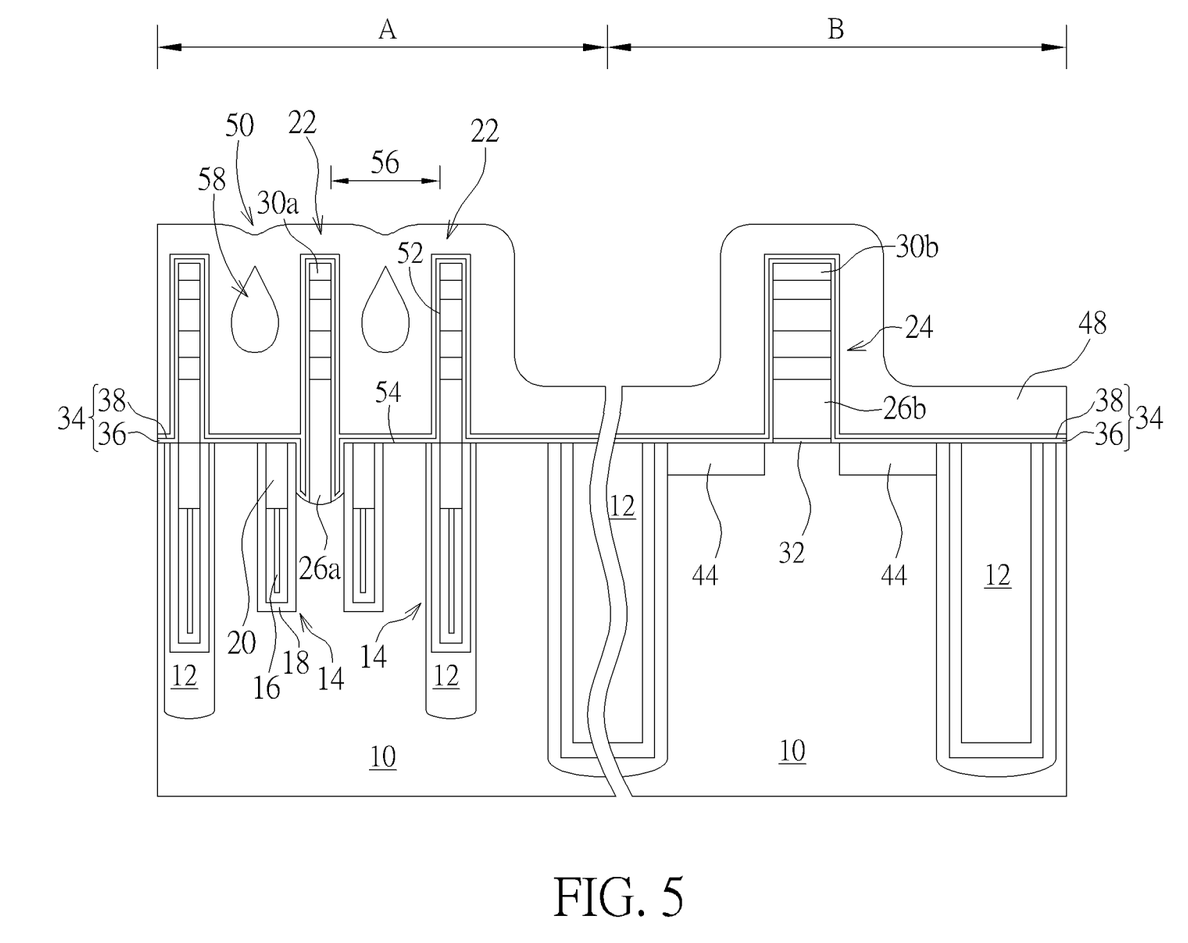
FIG. 5 depicts an oxide layer with a void according to another preferred embodiment of the present invention.

As shown in FIG. 5, if the insulating layer 34 is not cleaned by diluted hydrofluoric acid, and is instead cleaned by a mixture of phosphoric acid, hydrogen peroxide, ammonium hydroxide and deionized water, the oxide layer 48 is formed on the bottom 54 and the sidewall 52 of the recess 50 at the same deposition rate. Under this circumstance, because the aspect ratio of the recess is high (e.g. higher than 10), before the oxide layer 48 fills up the recess 50, the recess 50 is sealed by the oxide layer 48, and a void 58 is formed in the oxide layer 48. If the insulating layer 34 is not cleaned by the diluted hydrofluoric acid, the void 58 is formed in the oxide layer 48 within the memory cell region A.

Figure 6:
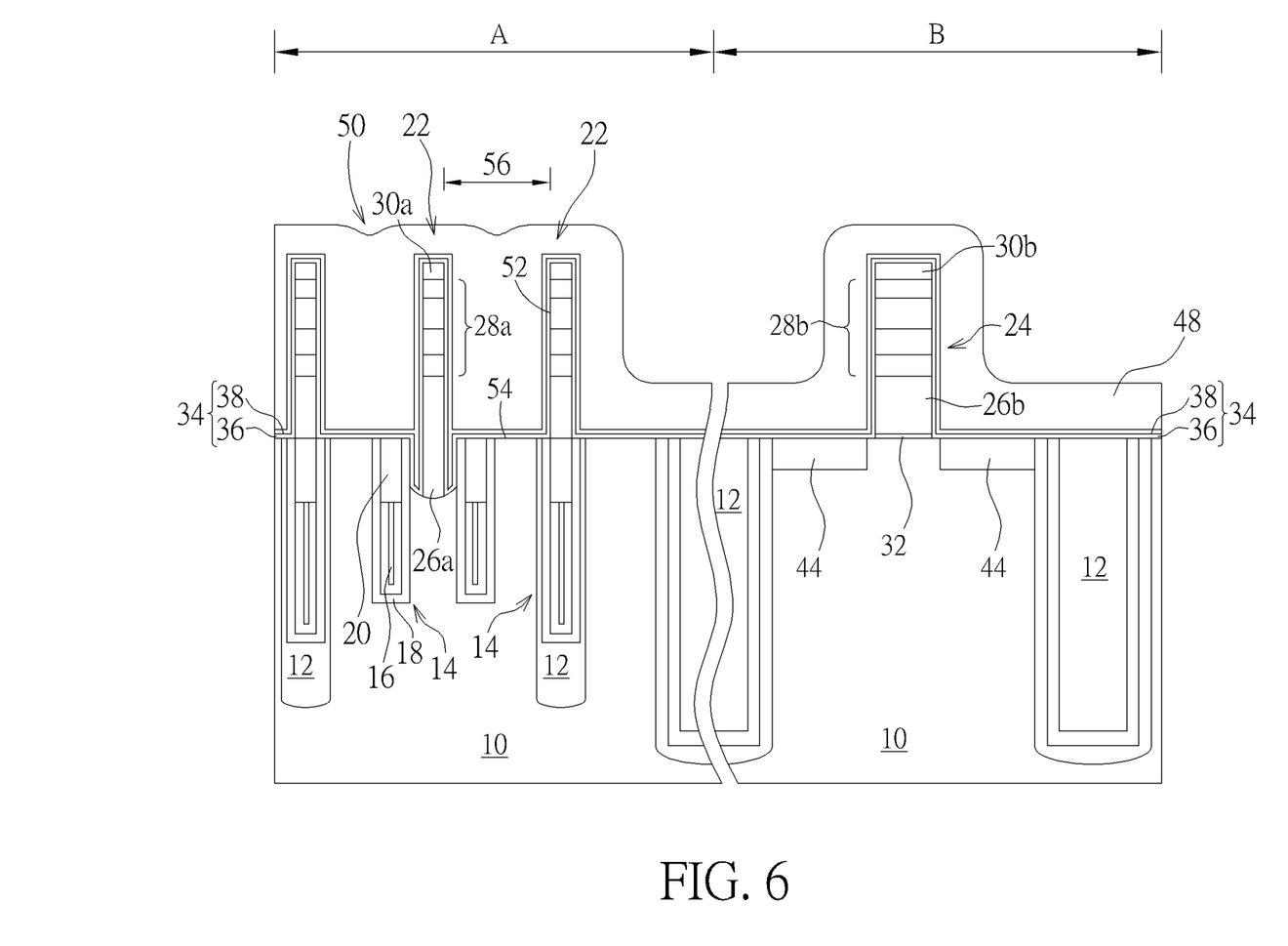
FIG. 6 is a fabricating stage following FIG. 3.
Figure 7:
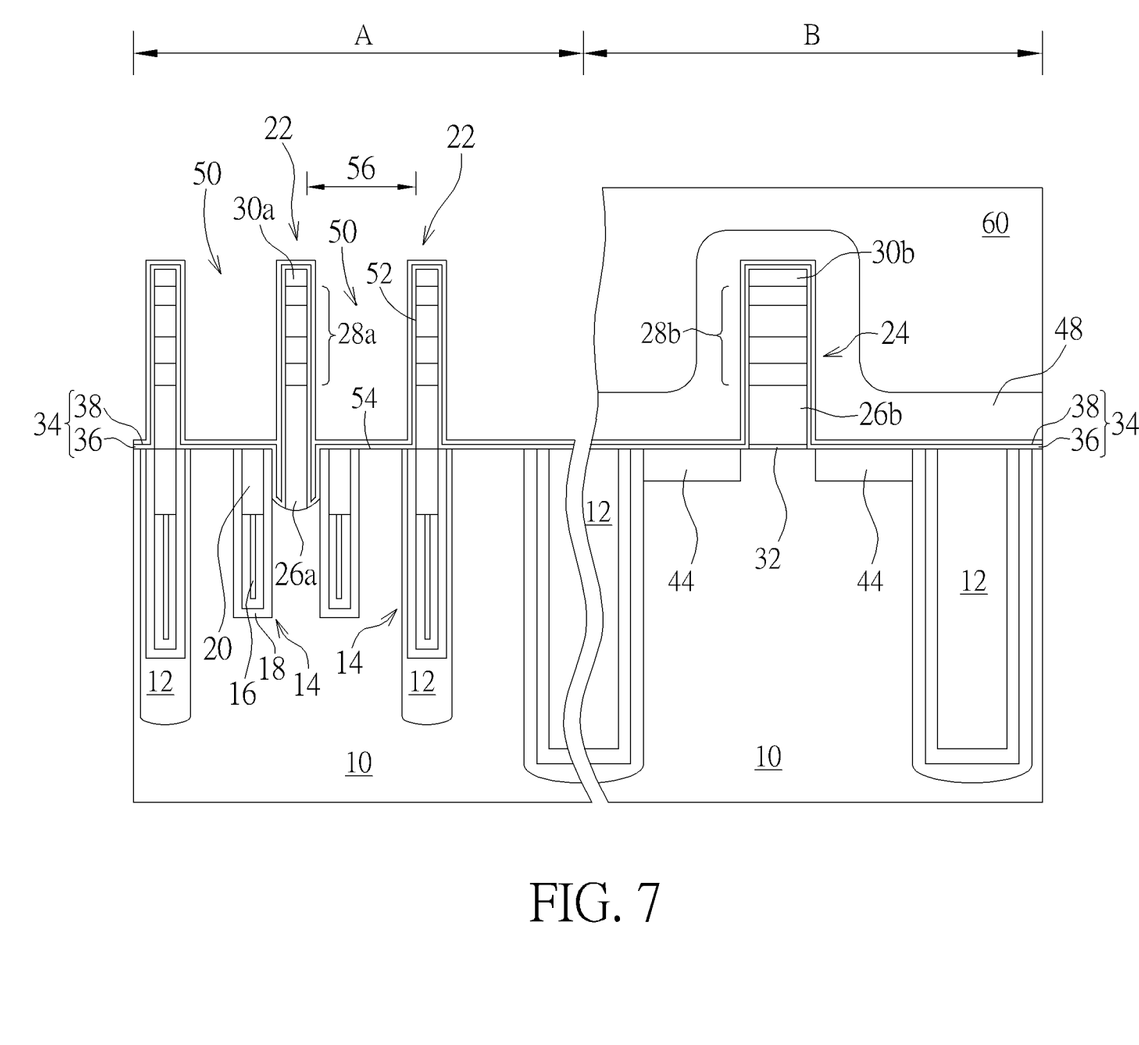
FIG. 7 is a fabricating stage following FIG. 6.

FIG. 6 continues from FIG. 3. As shown in FIG. 6, at this point, the oxide layer 48 is completed. In the present invention, because the recess 50 is sealed by the oxide layer 48 after the oxide layer 48 fills up the recess, there is no void in the oxide layer 48. As shown in FIG. 7, the oxide layer 48 in the memory cell region A is removed. In detail, a mask 46 is formed to cover the peripheral circuit region B and exposes the memory cell region A. Then, the memory cell region A is cleaned by a mixture of hydrofluoric acid and ammonium fluoride, and the oxide layer 48 in the memory cell region A is removed by a mixture of hydrofluoric acid and ammonium fluoride by taking the insulating layer 34 as an etching stop layer. Because there is no void in the oxide layer 48 in the recess 50, when the memory cell region A is cleaned by a solution, the solution will not flow to the oxide layer 48 in the peripheral circuit region B through the void in the oxide layer 48 in the memory cell region A. Therefore, the oxide layer 48 in the peripheral circuit region B can maintain its integrity. If the oxide layer 48 has a void 58 therein as shown in FIG. 5, the mixed solution of the hydrofluoric acid and ammonium fluoride flows to the oxide layer 48 in the peripheral circuit region B through the void 58 in the memory cell region A. Under this circumstance, the oxide layer 48 in the peripheral circuit region B is removed by the mixed solution of hydrofluoric acid and ammonium fluoride, causing the gate structure 24 in the peripheral circuit region B to be damaged.

Figure 8:
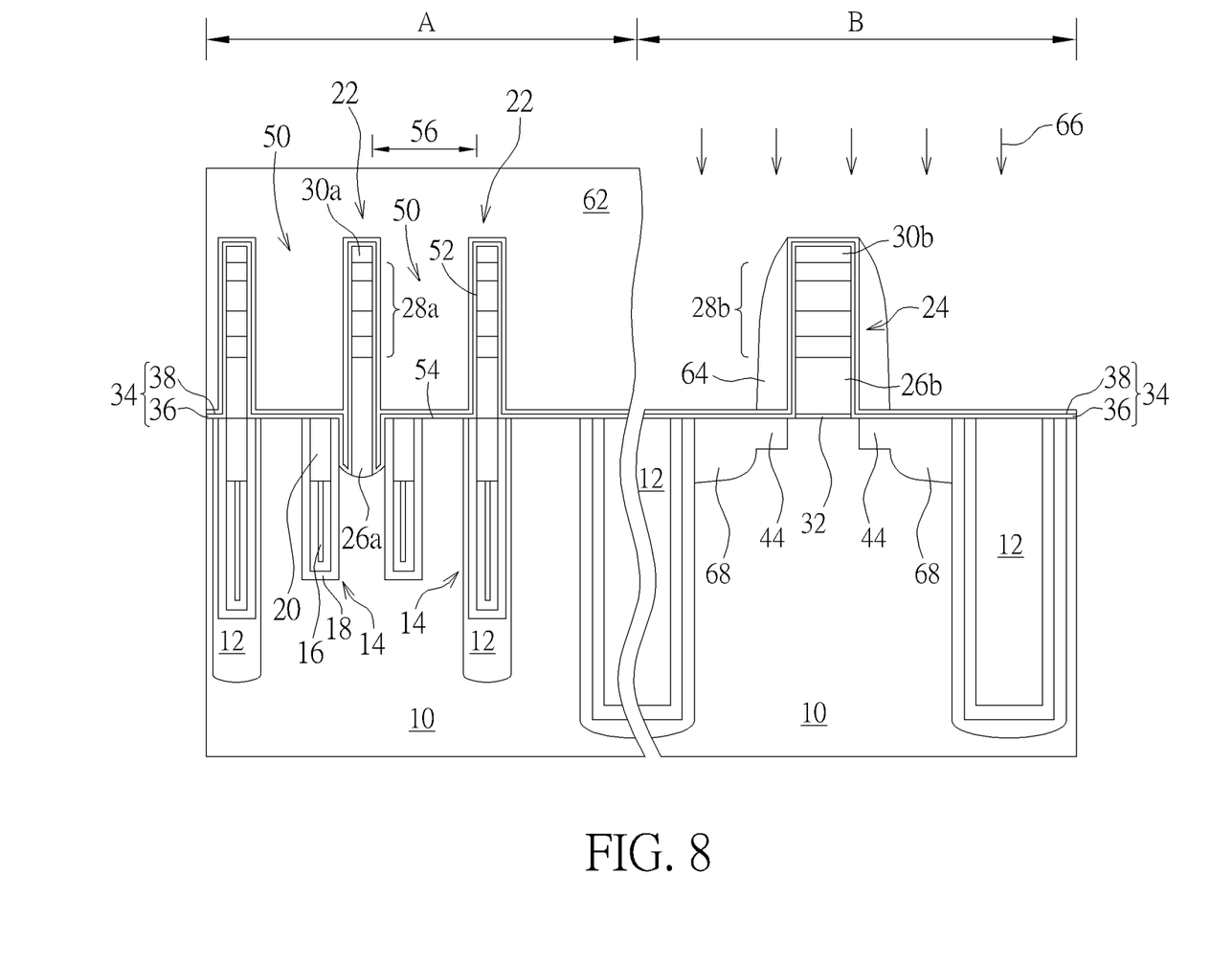
FIG. 8 is a fabricating stage following FIG. 7.

As shown in FIG. 8, the mask 60 is removed. Then, a mask 62 is formed to cover the memory cell region A. Later, part of the oxide layer 48 in the peripheral circuit region B is removed to form a spacer 64 at two sides of the gate structure 48. The oxide layer 48 can be removed by an etching process. Next, an ion implantation process 66 is performed to form a source/drain doped region 68 in the substrate 10 at two sides of the gate structure 24 by taking the spacer 64 and protective layer 30b as a mask. Finally, the mask 62 is removed.

The present invention uses diluted hydrofluoric acid to clean the memory cell region and the peripheral circuit region to remove the residue from the ion implantation after the lightly doped region is formed in the peripheral circuit region. After using diluted hydrofluoric acid, the silicon oxide layer on the bottom of the recess between bit lines is formed faster than the silicon oxide layer on the sidewall of the recess between bit lines. Therefore, the silicon oxide layer can fill up the recess before the silicon oxide layer seals up the opening of the recess. In this way, there is no void in the silicon oxide layer in the recess, and when removing the silicon oxide layer in the memory cell region, the gate structure in the peripheral circuit region will not be damaged.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fabricating method of an oxide layer within a peripheral region, comprising:
   providing a substrate divided into a memory cell region and a peripheral circuit region, wherein a plurality of conductive lines are disposed in the memory cell region, the conductive lines are adjacent to one another, a recess is disposed between the conductive lines adjacent to each other, an aspect ratio of the recess is between 10 and 12, and a gate structure is disposed within the peripheral circuit region;
   performing a first implantation process to form a lightly doped region in the substrate at two sides of the gate structure, respectively;
   after the first implantation process, performing a cleaning process to clean the memory cell region and the peripheral circuit region using diluted hydrofluoric acid; and
   after the cleaning process, forming an oxide layer to cover the memory cell region, the peripheral circuit region, the conductive lines and the gate structure.

2. The fabricating method of an oxide layer within a peripheral region of claim 1, further comprising:
   removing the oxide layer in the memory cell region.

3. The fabricating method of an oxide layer within a peripheral region of claim 2, further comprising:
   after removing the oxide layer in the memory cell region, removing part of the oxide layer on the gate structure to form a spacer; and
   performing a second implantation process to form a source/drain doped region in the substrate at two sides of the gate structure, respectively, by taking the gate structure and the spacer as a mask.

4. The fabricating method of an oxide layer within a peripheral region of claim 1, wherein after forming the oxide layer, the oxide layer entirely fills up the recess, and there is no void in the oxide layer.

5. The fabricating method of an oxide layer within a peripheral region of claim 1, wherein when forming the oxide layer to cover the conductive lines, the oxide layer covers the recess as well, and a formation rate of the oxide layer at a bottom of the recess is greater than a formation rate of the oxide layer at a sidewall of the recess.

6. The fabricating method of an oxide layer within a peripheral region of claim 5, further comprising:
   before the cleaning process, forming a silicon nitride layer to cover the bottom and the sidewall of the recess.

7. The fabricating method of an oxide layer within a peripheral region of claim 2, wherein the step of removing the oxide layer in the memory cell region comprises using a mixture of hydrofluoric acid and ammonium fluoride to remove the oxide layer in the memory cell region.

8. The fabricating method of an oxide layer within a peripheral region of claim 1, wherein the oxide layer is silicon oxide.

9. The fabricating method of an oxide layer within a peripheral region of claim 1, wherein the oxide layer is formed by an atomic layer deposition, a chemical vapor deposition or a physical vapor deposition.

10. A method of changing a formation rate of silicon oxide, comprising:
    providing a substrate, wherein two conductive lines are disposed on the substrate and a recess is between the conductive lines;
    performing a cleaning process to clean the substrate and the conductive lines using diluted hydrofluoric acid; and
    after the cleaning process, forming a silicon oxide layer to cover a sidewall and a bottom of the recess; wherein a formation rate of the silicon oxide layer at the bottom of the recess is greater than a formation rate of the silicon oxide layer at the sidewall of the recess.

11. The method of changing a formation rate of silicon oxide of claim 10, further comprising:
    before the cleaning process, forming a silicon nitride layer to cover the bottom and the sidewall of the recess.

12. The method of changing a formation rate of silicon oxide of claim 11, wherein the formation rate of the silicon oxide layer on the silicon nitride layer at the bottom of the recess is greater than the formation rate of the silicon oxide layer on the silicon nitride layer at the sidewall of the recess.

13. The method of changing a formation rate of silicon oxide of claim 10, wherein the silicon oxide layer fills up the recess entirely.

* * * * *